(12) United States Patent
Park et al.

(10) Patent No.: US 6,815,784 B2
(45) Date of Patent: Nov. 9, 2004

(54) MAGNETO-RESISTIVE RANDOM ACCESS MEMORY

(75) Inventors: Wan-jun Park, Seoul (KR); Taek-dong Lee, Daejeon (KR); Byeong-kook Park, Daejeon (KR); Tae-wan Kim, Anyang (KR); I-hun Song, Seongnam (KR); Sang-jin Park, Pyeongtaek (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/445,828

(22) Filed: May 28, 2003

(65) Prior Publication Data

US 2003/0222322 A1 Dec. 4, 2003

(30) Foreign Application Priority Data

May 29, 2002 (KR) .................................. 10-2002-29956

(51) Int. Cl.⁷ ............................................... H01L 29/82
(52) U.S. Cl. ........................ 257/421; 257/424; 257/427; 438/3
(58) Field of Search ........................... 257/421, 295–296, 257/414; 438/3, 257

(56) References Cited

U.S. PATENT DOCUMENTS 6,653,703 B2 * 11/2003 Hosotani et al. ............ 257/421
2002/0149962 A1 * 10/2002 Horiguchi ................... 365/173

* cited by examiner

Primary Examiner—Dung A. Le
(74) Attorney, Agent, or Firm—Lee & Sterba, P.C.

(57) ABSTRACT

A magneto-resistive random access memory includes a MOS transistor having a first gate and source and drain junctions on a substrate, a lower electrode connected to the source junction, a first magnetic layer on the lower electrode, a dielectric barrier layer including aluminum and hafnium on the first magnetic layer which, together with the first magnetic layer, form a potential well, a second magnetic layer on the dielectric barrier layer opposite the first magnetic layer, an upper electrode on the second magnetic layer, a second gate interposed between the first gate and the lower electrode to control the magnetic data of one of the first and second magnetic layers, and a bit line positioned orthogonal to the first gate and electrically connected to the upper electrode. Improved characteristics of the barrier layer increase a magnetic resistance ratio and improve data storage capacity of the magneto-resistive random access memory.

13 Claims, 7 Drawing Sheets

MAGNETO-RESISTIVE RANDOM ACCESS MEMORY

BACKGROUND OF THE INVENTION

1. Field of the Invention

The present invention relates to a magneto-resistive random access memory and a method of manufacturing the same. More particularly, the present invention relates to a magneto-resistive random access memory having a tunneling junction and a method of manufacturing the same.

2. Description of the Related Art

Magneto-resistive random access memories (RAMs) are formed of metal oxide semiconductor (MOS) transistors and magnetic tunneling junctions which are electrically connected to the MOS transistors to serve as signal storing capacitors. Thus, recorded data can be read via the magnetic tunneling junctions by applying a predetermined voltage to the MOS transistors.

A magneto-resistive RAM has the advantages of speed and non-volatility, making it very suitable for use as a memory device. Also, a magneto-resistive RAM has a cell structure that allows structures of peripheral circuits to be simplified.

Magneto-resistive RAMs generally use a memory core that connects MOS transistors and magnetic tunneling junction devices in series. Here, a data storage device must have a resistance value greater than that of a MOS transistor operating as a simple switch. Thus, magnetic tunneling junctions are currently used as memory devices of magneto-resistive RAMs.

Currently used magnetic tunneling junctions include an oxide aluminum layer ($Al_2O_3$) as an oxide barrier. The oxide aluminum layer ($Al_2O_3$) is formed by depositing and then oxidizing an aluminum (Al) layer. The oxide barrier serves as a potential barrier in the magnetic tunneling junction.

However, a potential barrier formed by such an oxide layer barrier is not refined, and thus a magnetic resistance ratio (hereinafter referred to as a MR ratio) tends to be reduced by an amount inversely proportional to an applied voltage. The reduction in the MR ratio may cause an operation error when storing and reading data, thereby greatly deteriorating the reliability of such a memory device.

SUMMARY OF THE INVENTION

In an effort to solve the problems described above, it is a feature of an embodiment of the present invention to provide a magneto-resistive random access memory that enables a potential barrier of a magnetic tunneling junction to be stably maintained so that a MR ratio may be stabilized and a reduction in the MR ratio with respect to an applied voltage may be minimized, and a manufacturing method thereof.

Accordingly, to achieve a feature of an embodiment of the present invention, there is provided a magneto-resistive random access memory including a MOS transistor formed of a first gate, a source junction and a drain junction on a semiconductor substrate, a lower electrode connected to the source junction, a first magnetic layer formed on the lower electrode, a dielectric barrier layer including at least aluminum and hafnium on the first magnetic layer which, together with the first magnetic layer, forms a potential well, a second magnetic layer formed on the dielectric barrier layer to be opposite the first magnetic layer, an upper electrode formed on the second magnetic layer, a second gate interposed between the first gate and the lower electrode to control the magnetic data of one of the first and second magnetic layers, and a bit line positioned orthogonal to the first gate and electrically connected to the upper electrode.

Preferably, the lower electrode includes a lower electrode layer formed to electrically connect the semiconductor substrate, and a buffer layer formed of an anti-magnetic material on the lower electrode layer. The lower electrode layer may be formed of a metal, such as aluminum (Al), ruthenium (Ru), tantalum (Ta), copper (Cu) or an alloy of Al and Cu. It is preferable that a barrier layer formed of one of an aluminum nitride (AlN) layer, a titanium nitride (TiN) layer, and a tungsten nitride (WN) layer is further formed under the lower electrode layer to intercept impurity atoms. Also, the buffer layer may be formed of tantalum (Ta), ruthenium (Ru), or the like. Alternatively, the buffer layer may be formed of one of IrMn, PtMn and FeMn. The first magnetic layer (generally, called a pinned layer) may be formed of CoFe, Co or NiCoFe. It is preferable that the dielectric barrier layer is formed of an alloy oxide layer in which hafnium is added to an aluminum oxide layer (Al2O3).

The second magnetic layer, which is a free layer film, may be formed of a ferromagnetic material on the dielectric barrier layer. The second magnetic layer may be formed of a paramagnetic material, preferably Permalloy (Py(NiFe)). The upper electrode is preferably formed of at least one of Al, Ru and Ta.

To provide another feature of an embodiment of the present invention, a method of manufacturing a magneto-resistive random access memory is provided, the method including forming an isolation dielectric layer on a semiconductor substrate to form a device active region, forming a first gate, a source area and a drain area in the device active region to form a MOS transistor, forming a second gate parallel to the first gate and forming a lower electrode of a conductive material to be connected to the source area of the MOS transistor, forming a first magnetic layer on the lower electrode to form a predetermined magnetic domain, forming a dielectric barrier layer of at least hafnium (Hf) and aluminum (Al) on the first magnetic layer, forming a second magnetic layer opposite the first magnetic layer on the barrier layer, and forming an upper electrode on the second magnetic layer so that the upper electrode is electrically connected to the second magnetic layer.

It is preferable that the isolation dielectric layer is formed of an oxide layer.

In the method described above, forming the first gate preferably includes forming a thin gate dielectric layer in the device active region, sequentially forming on the gate dielectric layer a gate conductive layer and a capping insulating layer that acts as a mask, forming a first gate pattern by in the capping insulating layer acting as a mask and the gate conductive layer, forming source and drain junctions on both sides of the first gate to complete a MOS transistor.

The gate dielectric layer may be formed of an oxide layer. Also, sidewall spacers may be formed of a dielectric material on sidewalls of the first gate pattern.

It is preferable that the gate conductive layer is formed of doped polycrystalline silicon. It is also preferable that the gate conductive layer be deposited by chemical vapor deposition. It is preferable that the capping insulating layer acting as a mask is a silicon dielectric layer formed by chemical vapor deposition. It is also preferable that the source and drain junctions be formed by an ion implantation method.

In the method described above, forming the second gate and the lower electrode preferably include forming a first interlayer insulating film on the entire surface of the semiconductor substrate, forming a first gate on the first interlayer insulating film, forming a second interlayer insulating film on the entire surface of the semiconductor substrate, forming a lower electrode layer of a conductive material layer on the second interlayer insulating film, forming a buffer layer of an anti-magnetic material on the lower electrode layer, and forming a lower electrode pattern on the lower electrode layer and the buffer layer.

Preferably, the conductive material layer is formed of at least one of Al, Ta, Ru, and AlN. The buffer layer may be formed of one of tantalum (Ta) or ruthenium (Ru) to improve surface flatness. However, the buffer layer may be formed of IrMn, PtMn, or FeMn. The first magnetic layer (pinned layer) may be formed of a ferrimagnetic material. Preferably, the first magnetic layer is formed of one of CoFe, Co, or NiCoFe.

In the method described above, forming the barrier layer preferably includes forming an aluminum-hafnium-oxide layer on the first magnetic layer by forming a multi-layered film of aluminum/hafnium on the first magnetic layer, supplying an oxygen source into the multi-layered film, and performing a thermal treatment to oxidize the aluminum and the hafnium. Here, the multi-layer is preferably formed by a physical vapor deposition method such as metal sputtering.

In the method described above, the second magnetic layer (free layer film), is preferably formed of a paramagnetic material (Py(NiFe)), which is a ferromagnetic material.

In the method described above, forming the upper electrode preferably includes forming a metal layer for an upper electrode layer on the second magnetic layer, and patterning the upper electrode layer to form an upper electrode. Here, the metal layer is preferably formed by depositing an aluminum nitride layer (AlN), on a metal layer formed of aluminum (Al), ruthenium (Ru), or tantalum (Ta).

After patterning the upper electrode, in order to secure the area of the magnetic memory device, the metal layer, the second magnetic layer, the barrier layer, and the first magnetic layer are removed by a general etching process, to complete the magnetic memory device.

BRIEF DESCRIPTION OF THE DRAWINGS

The above features and advantages of the present invention will become more apparent to those of ordinary skill in the art by describing in detail preferred embodiments thereof with reference to the attached drawings in which.

DETAILED DESCRIPTION OF THE INVENTION

Figure 1:
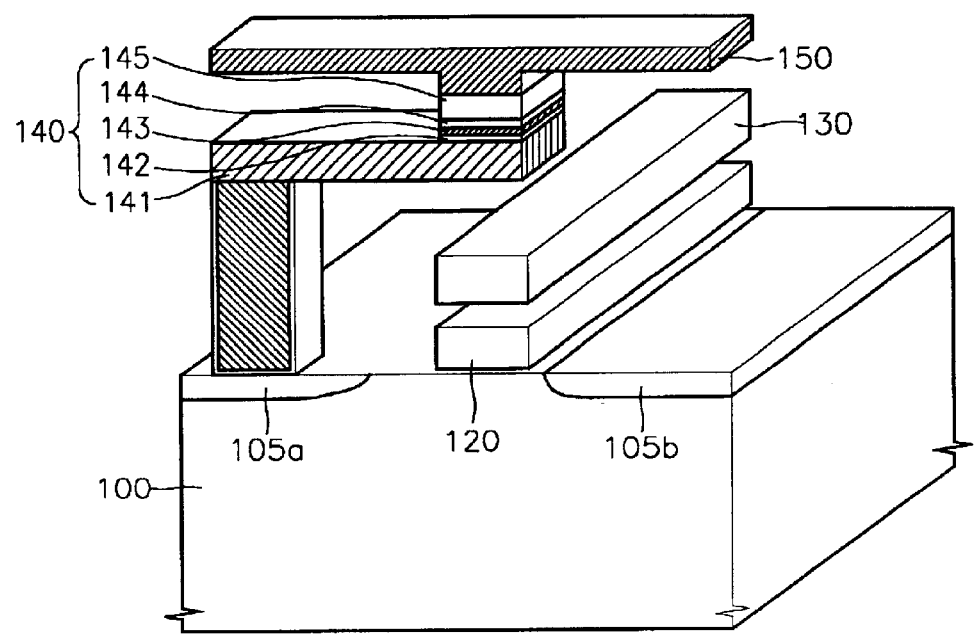
FIG. 1 illustrates a schematic perspective view of a magneto-resistive random access memory (RAM) according to the present invention.

Korean Patent Application No. 2002-29956, filed on May 29, 2002, and entitled: "Magneto-Resistive Random Access Memory And Method For Manufacturing The Same" is incorporated by reference herein in its entirety.

The present invention will be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

Figure 2:
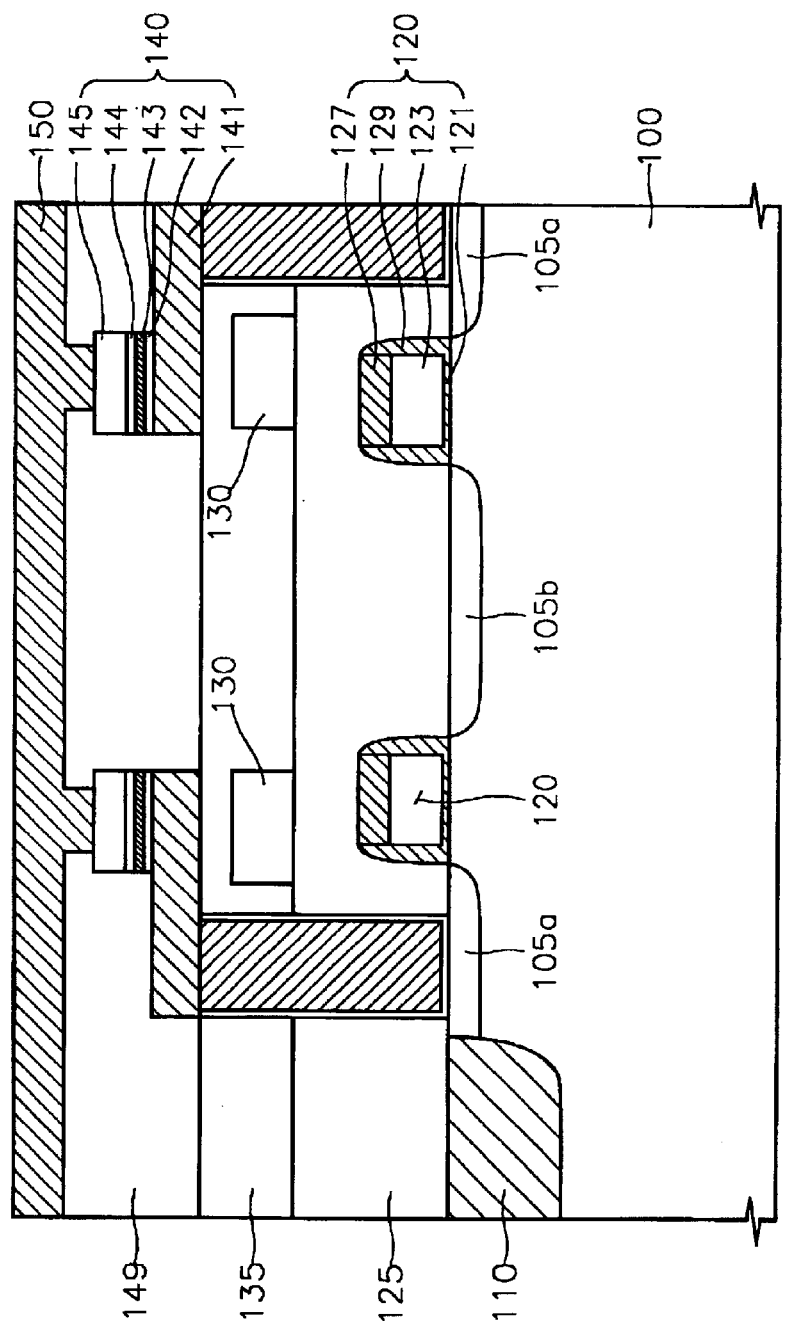
FIG. 2 illustrates a cross-sectional view of the magneto-resistive RAM according to the present invention.

FIG. 1 illustrates a schematic perspective view of a magneto-resistive random access memory (RAM) according to the present invention, and FIG. 2 illustrates a cross-sectional view of the magneto-resistive RAM according to the present invention.

Referring to FIGS. 1 and 2, the magneto-resistive RAM includes a plurality of metal oxide semiconductor (MOS) transistors, including gates 120, source junctions 105a, and drain junctions 105b, and magneto-resistive memory devices 140. The MOS transistors act as switches and are disposed in the form of a matrix on a semiconductor substrate 100.

As illustrated in FIG. 2, the gates 120 of the MOS transistors are formed by sequentially stacking gate dielectric layers 121 on the semiconductor substrate 100, gate conductive layers 123 on the gate dielectric layers 121, and capping insulating layers 127 on the gate conductive layers 123. The source and drain junctions 105a and 105b of the MOS transistors are formed in the semiconductor substrate 100 between the gates 120. Sidewall spacers 129, formed of an insulating material, are formed on sidewalls of the gates 120.

The magneto-resistive memory devices 140, which are magneto-resistive tunneling junctions, include lower electrodes 141, first magnetic layers 142, dielectric barrier layers 143, second magnetic layers 144, and upper electrodes 145. The lower electrodes 141 are formed to be connected to source junctions 105a of the MOS transistors. The first magnetic layers 142 are formed on the lower electrodes 141. The dielectric barrier layers 143 are formed on the first magnetic layers 142, and are formed of oxide layers including aluminum (Al) and hafnium (Hf). The second magnetic layers 144 are formed as counter electrodes to the first magnetic layers 142. The upper electrodes 145 are stacked on the second magnetic layers 144.

Figure 3:
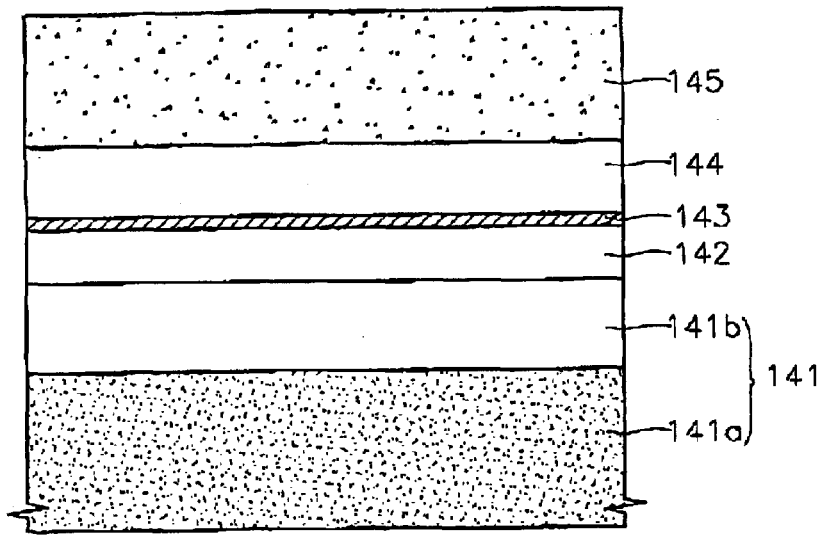
FIG. 3 illustrates an enlarged cross-sectional view of a magnetic memory device.

Here, as illustrated in FIG. 3, the lower electrodes 141 are formed by stacking lower electrode layers 141a, which are formed of conductive metal layers, and buffer layers 141b, which are formed of an anti-magnetic material, on the lower electrode layers 141a to form one electrode of the magneto-resistive memory devices. The first magnetic layers 142 are formed of a ferrimagnetic material to fix a magnetized direction to one direction. The dielectric barrier layers 143 are formed of oxide layers in which aluminum (Al) and hafnium (Hf) are mixed.

The lower electrode layers 141a are formed to a predetermined thickness on the semiconductor substrate, and are preferably formed of Al, Cu Ta, Ru, AlN or an alloy of Al and Cu, to prevent out-diffusion of hafnium (Hf) used in the dielectric barrier layers 143 containing elements having conductivity and a dense structure. Further, a barrier layer of an aluminum nitride (AlN) layer, a titanium nitride (TiN) layer, or a tungsten nitride (WN) layer may be formed under the metal layer to intercept impurity atoms.

The second magnetic layers 144 are formed of a ferromagnetic material on the barrier layers 143, and are generally called free layer films. Here, since the second magnetic layers 144 are formed of Permalloy (Py(NiFe)), which is a paramagnetic material contained in a ferromagnetic material, the second magnetic layers 144 always form a magnetic spin in the same direction. The second magnetic layers 144 operate as counter electrodes to the first magnetic layers 142, and control changes in magnetic resistance. Thus, the second magnetic layers 144 make pairs with the ferrimagnetic material of the first magnetic layers 142 to form a predetermined magnetic resistance. Here, a small magnetic resistance is formed in a direction identical to the direction of the magnetic spin of the first magnetic layers 142 while a large magnetic resistance is formed in the opposite direction to the orientation of the magnetic spin of the first magnetic layers 142. Thus, when sensing signals, resistances having different magnitudes are sensed to discriminately store and sense data. In other words, when resistance is small, since a voltage is low, data is written in an off state and when resistance is large, since the voltage is high, data is read in an on state. As a result, by employing predetermined electrical means and orientations of magnetism, data is magnetically written using the second gates while data is electrically read using the first gates.

The upper electrodes 145 are formed on the second magnetic layer by sputtering or evaporating a conductive metal, such as aluminum (Al) or tantalum (Ta), by physical vapor deposition (PVD). The upper electrodes 145 may be formed by chemical vapor deposition (CVD), electroplating, or the like.

FIG. 3 is an enlarged cross-sectional view of a magnetic memory device of the magneto-resistive RAM of the present invention. Referring to FIG. 3, the lower electrodes 141 are formed on the semiconductor substrate 100. The lower electrodes 141 are formed by stacking the lower electrode layers 141a, which are formed of metal layers, and the buffer layers 141b, which are formed of anti-magnetic layers, on the lower electrode layers 141a. The first magnetic layers 142 are formed of a ferrimagnetic material on the buffer layers 141. The barrier layers 143 are formed on the first magnetic layers 142 by oxidizing a mixture of Al and Hf. The second magnetic layers 144 are formed on the barrier layers 143 as counter electrodes to the first magnetic layers 142. The upper electrodes 145 are formed on the second magnetic layers 144 to be electrically connected to the second magnetic layers 144. Here, since the barrier layers 143, i.e., aluminum-hafnium-oxide (Al—Hf—O) layers, have no defects therein, the Al—Hf—O layers 143 have excellent thin film characteristics. In particular, the Al—Hf—O layers 143 are interposed between magnetic materials to increase a MR ratio in a tunneling magnetic resistance curve between the magnetic materials.

The Al—Hf—O layers 143 may be formed by two methods. In the first method, the first magnetic layers 142 are coated with Al and Hf, which are oxidized at a low temperature by natural oxidation or oxygen plasma so that the Al and Hf are combined with oxygen (O) to form oxide layers. In the second method, Hf—Al mixture layers are formed on the lower electrodes 141 by sputtering a metal target of an alloy of Al and Hf, and, at the same time, an oxide atmosphere is made to form Al—Hf—O layers. Besides these methods, there may be another method of forming Al—Hf oxide layers by sputtering an Al—Hf—O target.

The second magnetic layers 144 are formed on the dielectric barrier layers 143. Also, the second magnetic layers 144 are formed of a ferromagnetic material opposite to a ferrimagnetic material of the first magnetic layers 142 so that the dielectric barrier layers 143 are interposed between the first magnetic layers 142 and the second magnetic layers 144. Specifically, the second magnetic layers 144 are formed of a nickel-iron (Ni—Fe) alloy, which is a paramagnetic material. Thus, when a predetermined electromagnetic field is applied to the second magnetic layers 144, a magnetic spin is arranged in a predetermined direction around the second magnetic layers 144 so that the second magnetic layers 144 are magnetized.

The upper electrodes 145 are formed of a metal having a high conductivity and a high deposition rate. For example, the upper electrodes 145 may be formed by depositing a metal such as aluminum (Al), tantalum (Ta), or ruthenium (Ru) using a predetermined method. Hard conductive nitride layers, such as aluminum nitride layers (AlN), are interposed between the upper electrodes 145 and the second magnetic layers 144 to prevent transition metal atoms, i.e., metal ions, contained in a magnetic material from being out-diffused and penetrating into a bit line, which will be formed later, and the semiconductor substrate 100. As a result, reliability of memory devices may be improved.

In FIGS. 1 and 2, second gates 130 are formed between the lower electrodes 141 and the first gates 120 and positioned over the first gates 120 so that the buffer layers 141b (of FIG. 3) of the lower electrodes 141 and the first magnetic layers 142 have a predetermined magnetism. As a result, magnetic-resistance of the memory devices may be changed to write data.

Figure 4:
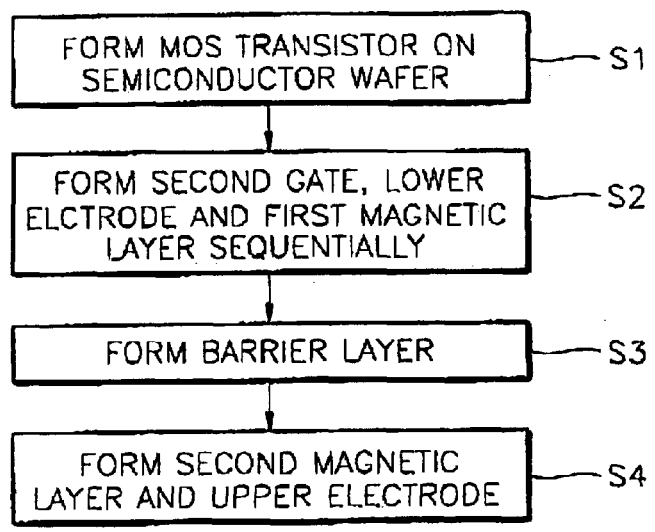
FIG. 4 is a flowchart explaining a method of manufacturing the magneto-resistive random access memory according to the present invention.

FIG. 4 is a flowchart for explaining a method of manufacturing the magneto-resistive RAM according to an embodiment of the present invention. FIGS. 5 through 9 illustrate cross-sectional views for explaining a method of manufacturing the magneto-resistive RAM according to an embodiment of the present invention. Here, steps of the method shown in FIGS. 5 through 9 will be described with reference to the flowchart shown in FIG. 4.

Figure 5:
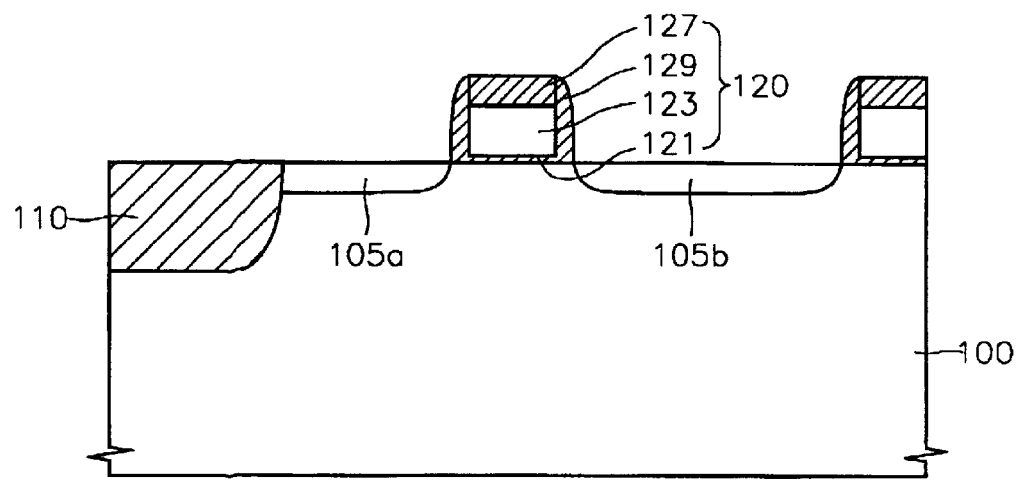
FIGS. 5 through 9 illustrate cross-sectional views for explaining the method of manufacturing the magneto-resistive random access memory according to the present invention.

Referring to FIGS. 2, 4 and 5, in step S1, a MOS transistor is formed on a semiconductor substrate 100 using a predetermined device forming process. Specifically, an isolation dielectric layer 110 defining a device forming area is formed, and a gate dielectric layer 121, a gate conductive layer 123, and a capping insulating layer 127 are sequentially stacked in the device forming area. The semiconductor substrate 100 is coated with photoresist (not shown) and then patterned to form a first gate pattern. The capping insulating layer 127 and the gate conductive layer 123 are dry etched by using the first gate pattern as a mask to complete the first gate 120.

Sidewall spacers 129, formed of an insulating material, are formed on sidewalls of the gates 120. Next, source and drain junctions 105a and 105b are formed in the substrate 100 neighboring the first gate 120 by using the first gate 120 as a mask. Here, the source and drain junctions 105a and 105b are formed by implanting impurity ions into the semiconductor substrate 100 and then performing a predetermined thermal process annealing.

Figure 6:
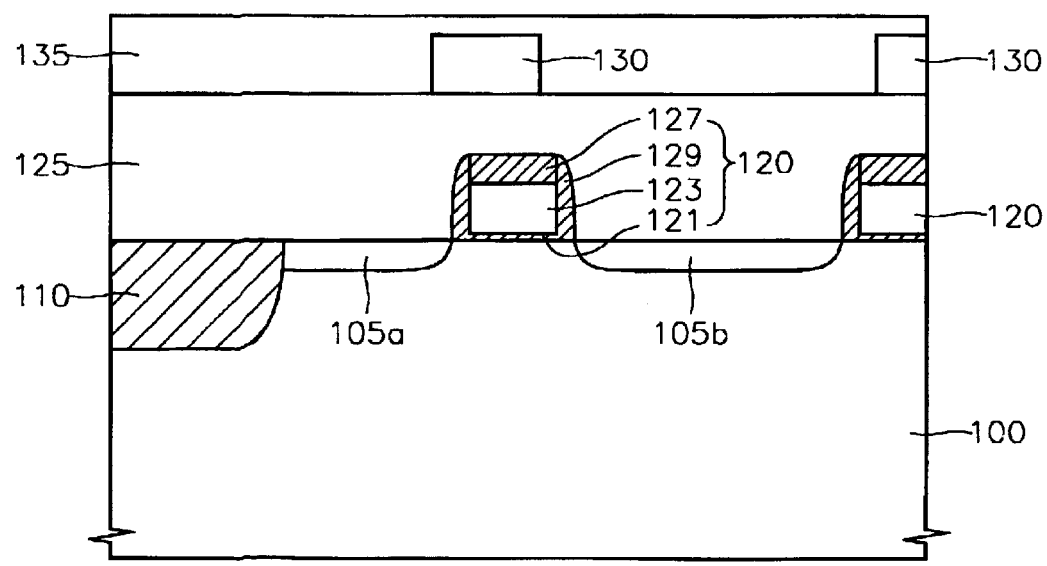

Referring to FIGS. 2 and 6, a silicon insulating layer is formed on the entire surface of the semiconductor substrate 100, including the first gate 120 and the source and drain junctions 105a and 105b, as a first interlayer insulating film 125. The silicon insulating layer of the first interlayer insulating film 125 is a silicon oxide layer or a silicon nitride layer formed by chemical vapor deposition (CVD). Next, a second gate 130 is formed on the first interlayer insulating film 125 to be parallel to the first gate 120. The second gate 130 is insulated from the first gate 120 by the first interlayer insulating film 125.

The second gate 130 serves to control the magnetization direction of the magnetic field of a buffer layer 141b of a lower electrode 141 and a first magnetic layer 142 that will be formed later, so that data is written as on "0" or off "1" in a magnetic memory. Also, if it is desired to erase written data, a predetermined voltage is applied to the second gate 130 to remove the magnetism and erase written data.

Thereafter, a second interlayer insulating film 135 is formed on the entire surface of the semiconductor substrate 100 on which the second gate 130 is formed. The second interlayer insulating film 135 is then planarized. Here, the second interlayer insulating film 135 is a silicon insulating layer formed by CVD. Also, it is preferable that borophosphouric silicate glass (BPSG) and a reflow process or CVD are used to planarize the interlayer insulating film 135.

Figure 7:
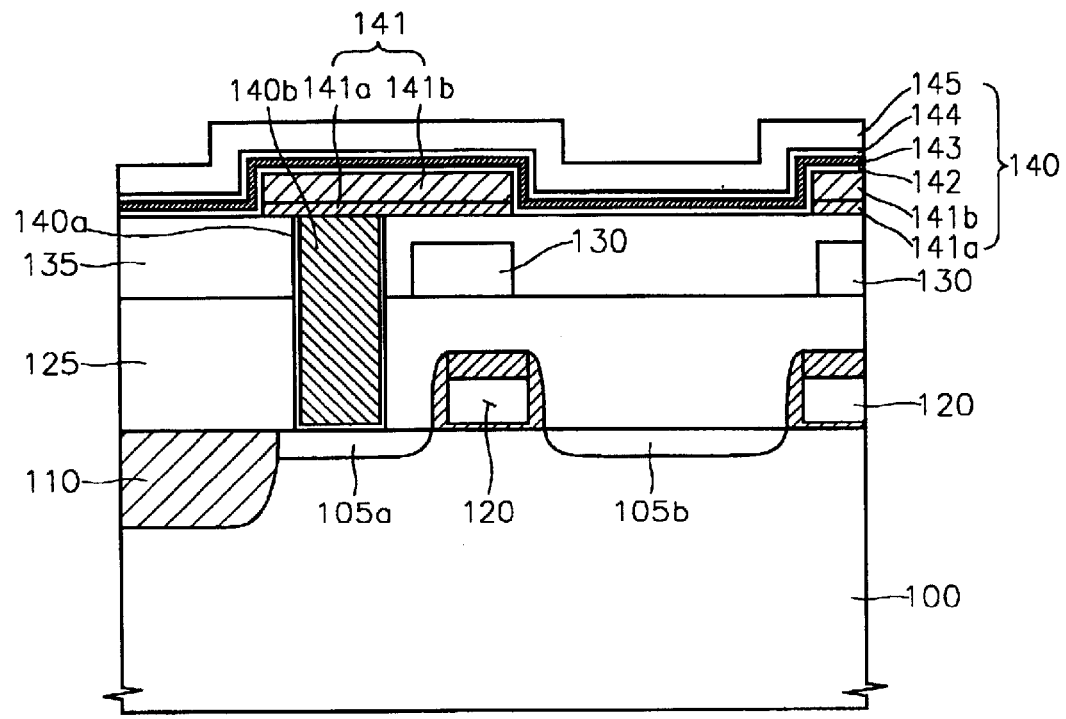

Referring to FIGS. 2 and 7, in step S2, a contact hole 140a is formed in the first and second interlayer insulating films 125, 135 by a predetermined photo/etch process to expose the source area 105a of the MOS transistor. A hard aluminum nitride layer (AlN) may be formed between a contact 140b and a lower electrode layer 141a to prevent deterioration of electrical characteristics due to penetration into the semiconductor substrate 100 of transition metal atoms contained in a magnetic material of the buffer layer 141b of FIG. 3, which will be formed later. Here, an impurity barrier layer, similar to the aluminum nitride layer (AlN), may be formed in the contact hole 140a of a metal nitride layer such as a tungsten nitride (WN) layer or a titanium nitride (TiN) layer. When the contact hole 140a is filled, it becomes a contact 140b for the source junction 105a and the magneto-resistive memory devices 140.

Next, the lower electrode 141 is formed on the second interlayer insulating film 135. The lower electrode 141 is formed by depositing the lower electrode layer 141a of FIG. 3 on the entire surface of the semiconductor substrate 100 on which the contact 140b is formed. Here, the contact 140b and the lower electrode layer 141a are formed of a metal, such as aluminum (Al), tantalum (Ta), ruthenium (Ru), copper (Cu) or an alloy of Al and Cu, by physical vapor deposition (PVD) or CVD, and the contact 140b and the lower electrode layer 141a may be formed simultaneously. After the lower electrode layer 141a is formed, a lower electrode pattern is formed by performing a predetermined photo/etch process to complete the lower electrode 141. The buffer layer 141b of FIG. 3 is formed of an anti-magnetic material on the semiconductor substrate 100 on which the lower electrode layer 141a is formed. The anti-magnetic material with which the buffer layer 141b is formed is preferably IrMn, PtMn, or FeMn. However, the buffer layer 141b may also be formed of Ta or Ru. Thus, a bilayer of the lower electrode layer 141a and the buffer layer 141b is formed as the lower electrode 141.

Thereafter, in step S2, a first magnetic layer 142 (generally called a pinned layer) is formed of a ferrimagnetic material on the lower electrode 141. Here, the ferrimagnetic material is CoFe, Co, or NiCoFe. The first magnetic layer 142 (the pinned layer) of a ferrimagnetic material may be formed by performing a deposition process when a predetermined electrical field is applied to the first magnetic layer or by performing a cooling process after thermal treatment in a magnetic field to fix the magnetic field to a predetermined direction.

An ultra thin film is formed to a thickness of about 10–20 Å by sputtering aluminum (Al) and hafnium (Hf) on the first magnetic layer 142. Then, in step S3, an oxidization atmosphere is created to combine the Al and Hf with oxygen, thereby forming a hafnium-aluminum-oxide (Al—Hf—O) layer on the first magnetic layer 142 as a dielectric barrier layer 143. Here, the oxidization atmosphere may be created by a natural method of exposing a semiconductor substrate at an ambient temperature for a predetermined period of time, or by a method of forming an oxide layer using oxygen plasma. Either method may be performed at a low temperature.

The Al—Hf—O layer may also be formed by creating an oxygen atmosphere during sputtering by using an alloy target of Hf and Al. The Al—Hf—O layer may be formed by PVD by using an Al—Hf oxide layer as a sputtering target.

In step S4, a second magnetic layer 144, having a magnetic spin opposite that of the first magnetic layer 142, is formed on the barrier layer 143, and then an upper electrode 145 is formed on the second magnetic layer 144. The second magnetic layer (a free layer film) 144, which is a counter magnetic electrode opposite to a magnetic layer formed of the buffer layer 141b (of FIG. 3) of the lower electrode 141 and the first magnetic layer 142, is formed of a ferromagnetic material. It is preferable that the second magnetic layer 144 is formed of a ferromagnetic material called Permally (Py(NiFe)), which is a permanent magnet. Next, a metal layer is formed on the second magnetic layer 144 as the upper electrode 145. For low manufacturing cost and a simple process, it is preferable that the metal layer is formed of Al, Ta, or Ru by PVD.

Figure 8:
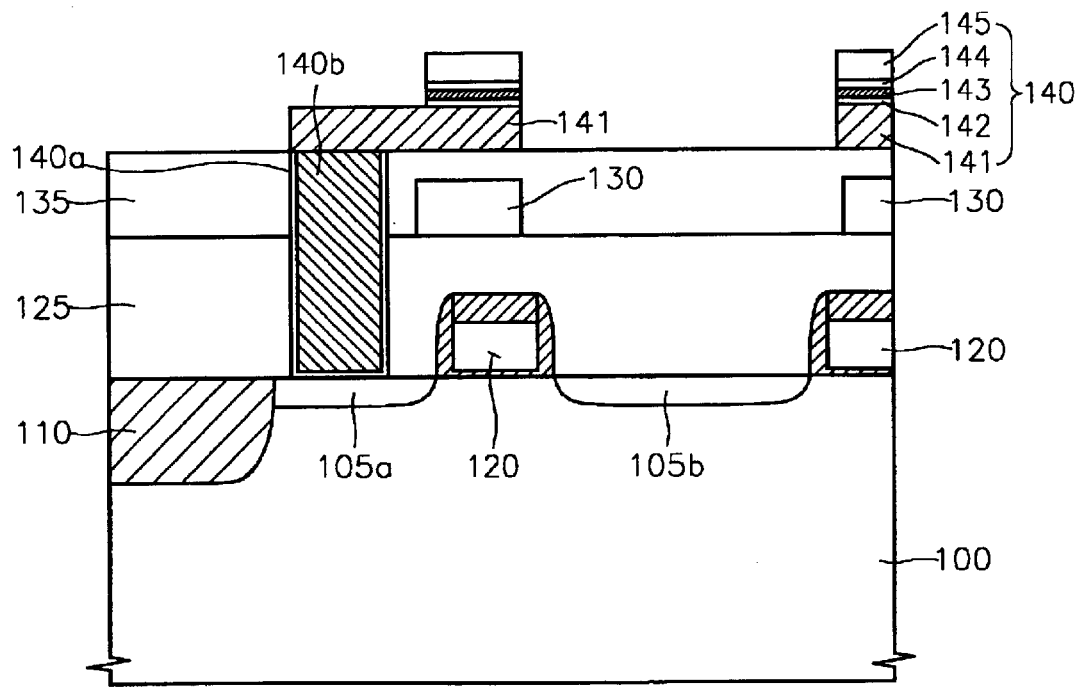

Referring to FIGS. 2 and 8, a stack layer of the lower electrode 141, the barrier layer 143, and the upper electrode 145 is patterned to complete a magnetic memory device 140. Specifically, photoresist (not shown) is coated on the substrate and then patterned by photolithography to form a memory pattern. Next, the upper electrode 145, the second magnetic layer 144, the barrier layer 143, the first magnetic layer 142, and the buffer layer 141a (of FIG. 3) of the lower electrode 141 are dry etched using the memory pattern as a mask, thereby completing the magnetic memory device 140.

Figure 9:
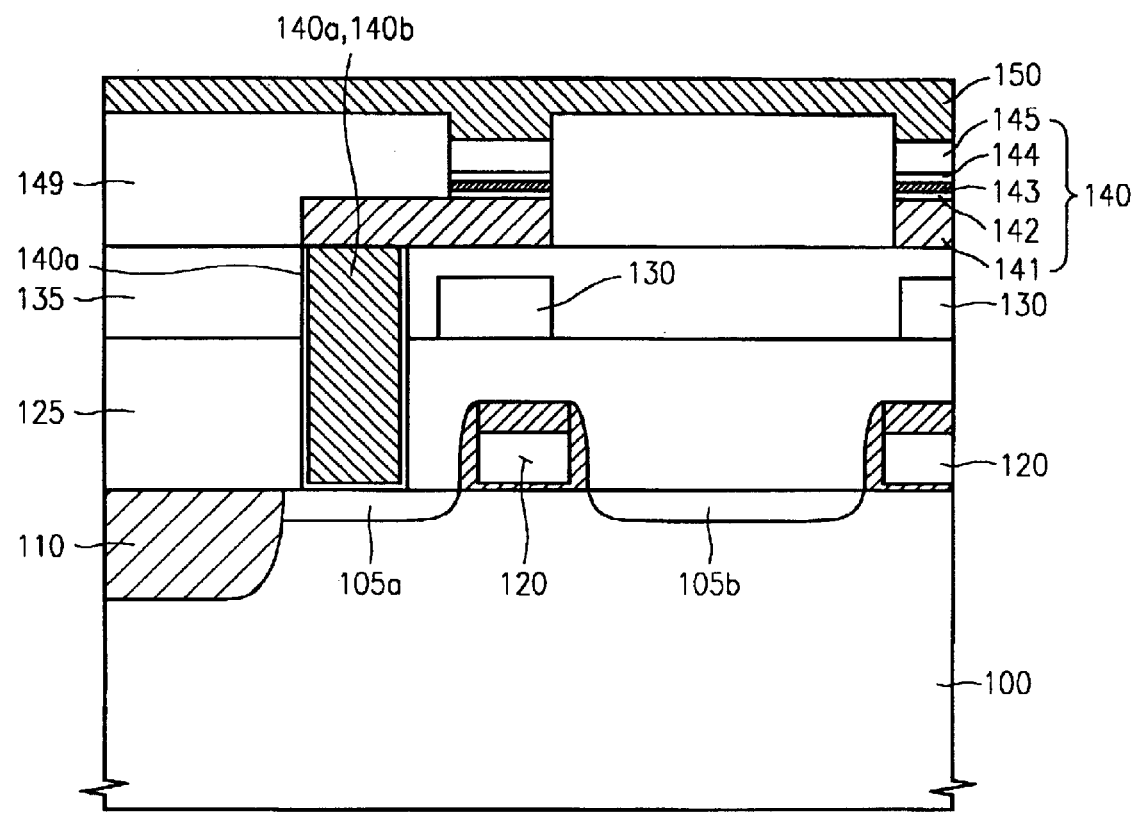

Referring to FIGS. 2 and 9, after the magnetic memory device 140 is formed, a bit line 150 is formed to be connected to the upper electrode 145 of the magnetic memory device 140 in a series of bit line processes. Specifically, a third interlayer insulating film 149 is formed on the entire surface of the semiconductor substrate 100, and a predetermined contact hole (not shown) is formed to expose the upper surface of the upper electrode 145 in a contact formation process. A conductive layer (not shown) for a bit line is formed to a predetermined thickness to completely fill the contact hole. Here, the conductive layer is formed of a metal layer (e.g., aluminum, tungsten, or the like) or a silicide layer (e.g., tungsten silicide, etc.). The conductive layer undergoes a photo/etch process to form the bit line 150, which is orthogonal to the first gate 120 and the second gate 130.

As described above, if an aluminum-hafnium-oxide layer is used as the dielectric barrier layer 143 of the magnetic memory device, an amount of oxygen combined with aluminum (Al) and hafnium (Hf) is reduced in a process of oxidizing the aluminum (Al) and hafnium (Hf). As a result, distortion of the aluminum-hafnium-oxide layer is reduced so that the aluminum-hafnium-oxide dielectric layer thus formed is only slightly stressed and has almost no defects. The magnetic characteristic of the magnetic memory device to write and read data using a MR ratio is therefore improved.

Figure 10A:
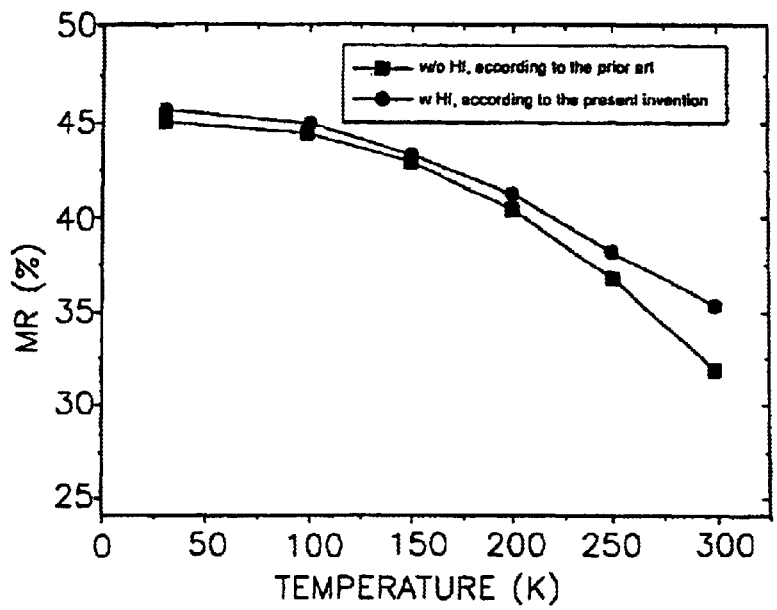
FIGS. 10A and 10B are graphs showing a MR ratio versus a temperature and an applied voltage to compare the magneto-resistive random access memory of the present invention with a magneto-resistive random access memory of the prior art.
Figure 10B:
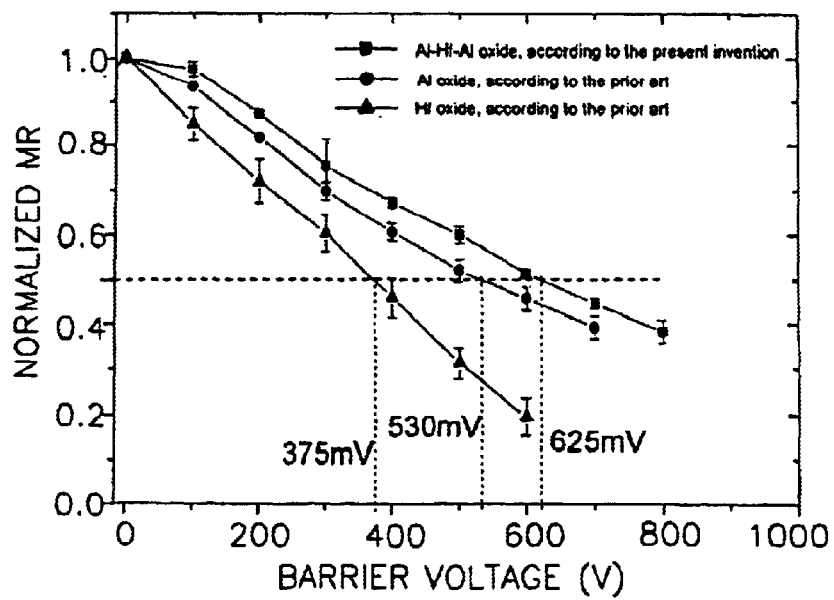

FIGS. 10A and 10B are graphs showing a magnetic resistance ratio with respect to a temperature and an applied voltage, respectively, to compare the magneto-resistive RAM of the present invention with a magneto-resistive RAM of the prior art. In FIG. 10A, the X-axis and Y-axis represent a temperature and a MR ratio, respectively. In FIG. 10B, the X-axis and Y-axis represent an applied voltage and a normalized MR ratio, respectively.

Referring to FIG. 10A, it may be seen that the MR ratio decreases with an increase in temperature in both the magneto-resistive RAM of the present invention, represented by the trace having circles interposed thereon, and the magneto-resistive RAM of the prior art, represented by the trace having squares interposed thereon. However, the change in MR ratio in the magneto-resistive RAM of the present invention with respect to the change in temperature is small, indicating that the MR ratio is stable with respect to changes in temperature.

In FIG. 10B, it may be seen that on a basis of 50% of the normalized MR ratio, MR ratios of an existing aluminum oxide layer ($Al_2O_3$), represented by the trace having circles interposed thereon, and a hafnium oxide layer, represented by the trace having triangles interposed thereon, are about 375 mV and 530 mV, respectively, while a MR ratio of an aluminum-hafnium-oxide layer of the present invention, represented by the trace having squares interposed thereon, is increased to 625 mV.

In the present invention, the lower electrode includes a metal layer, which is formed to contact the semiconductor substrate, and a buffer layer, which is formed of an antimagnetic material on the lower electrode. The metal layer may be formed of aluminum (Al) for general interconnection, copper (Cu), or an alloy of Al and Cu. The buffer layer is formed of tantalum (Ta), ruthenium (Ru), or the like. Alternatively, the buffer layer may be formed of a ferromagnetic material. If the buffer layer is formed of a ferromagnetic material, such as IrMn, PtMn or FeMn, it makes a pair with a paramagnetic material of the second magnetic layer to store signals. The first magnetic layer (the pinned layer) may be formed of CoFe, Co or NiCoFe. The dielectric barrier layer is formed of an alloy oxide of hafnium (Hf) and aluminum (Al) to strengthen the characteristics of the dielectric barrier layer interposed between a ferrimagnetic material and a ferromagnetic material.

The second magnetic layer, which is a free layer film, is formed of a ferromagnetic material on the dielectric barrier layer. The upper electrode formed on the second magnetic layer serves to protect the second magnetic layer and connect a circuit for detecting signals and a core cell. As a result, a circuit capable of controlling magnetic data is completed as a memory device. The second magnetic layer is formed of a paramagnetic material to operate as an electrode counter to the first magnetic layer formed of the ferrimagnetic material. The paramagnetic material is preferably Permalloy (Py (NiFe)) so that magnetization direction may be easily changed with a small amount of current. Thus, the paramagnetic material is suitable for a free layer film.

In the method of manufacturing a magneto-resistive random access memory of the present invention, it is preferable that the isolation dielectric layer is formed of a silicon oxide layer to simplify the isolation process and form a high-density memory device. The sidewall spacers may be formed of a silicon dielectric material such as a silicon nitride layer or a silicon oxide layer, which results in a highly integrated magnetic memory device. As a result, although a gate channel becomes narrow, a short channel effect may be prevented.

Also in the present invention, if the gate conductive layer is formed of doped poly crystalline silicon by chemical vapor deposition, the resistivity may be easily controlled.

If the mask capping insulating layer is a silicon dielectric layer, such as a silicon nitride layer or a silicon oxide layer formed by chemical vapor deposition, the mask capping insulating layer will protect the upper part of the gate conductive layer from being harmed by a subsequent etching process.

The source and drain junctions of the MOS transistor may be formed by a predetermined thermal diffusion method such as POCl3 doping, however, as previously stated, they are preferably formed by an ion implantation method by which doping ions are implanted to a predetermined depth in the semiconductor substrate to reduce thermal stress on the semiconductor substrate.

As described above, in the magneto-resistive random access memory according to the present invention, a high-density oxide layer is formed as a barrier layer by oxidizing hafnium (Hf) and aluminum (Al). Thus, a magnetic resistance ratio between a second magnetic layer (free layer film) and a first magnetic layer formed of magnetic materials may be greatly improved, thereby strengthening a memory capacity of a magnetic memory device of the magneto-resistive random access memory.

In the method of manufacturing the magneto-resistive RAM of the present invention, an aluminum-hafnium-oxide (Al—Hf—O) layer is used as a potential barrier layer. By using the aluminum-hafnium-oxide (Al—Hf—O) layer as the potential barrier layer, a magnetic resistance ratio of a magnetic memory device of the magneto-resistive RAM may be considerably increased, so that data storage capacity of the magneto-resistive RAM is improved.

Also, in the present invention, the aluminum-hafnium-oxide (Al—Hf—O) layer used as the potential barrier layer in the magnetic memory device to which positive and negative voltages are alternately applied has an only slightly-stressed layer structure and almost no defects. Accordingly, reliability of the barrier layer may be improved.

What is claimed is:

1. A magneto-resistive random access memory comprising:

a MOS transistor formed of a first gate, a source junction and a drain junction on a semiconductor substrate;

a lower electrode connected to the source junction;

a first magnetic layer formed on the lower electrode;

a dielectric hauler layer including at least aluminum and hafnium on the first magnetic layer which, together with the first magnetic layer, forms a potential well;

a second magnetic layer formed on the dielectric barrier layer to be opposite the first magnetic layer;

an upper electrode formed on the second magnetic layer;

a second gate interposed between the first gate and the lower electrode to control the magnetic data of one of the first and second magnetic layers; and a bit line positioned orthogonal to the first gate and electrically connected to the upper electrode.

2. The magneto-resistive random access memory as claimed in claim 1, wherein the lower electrode comprises:

a lower electrode layer formed to electrically connect the semiconductor substrate; and a buffer layer formed of an anti-magnetic material on the lower electrode layer.

3. The magneto-resistive random access memory as claimed in claim 2, wherein the lower electrode layer comprises one of Al, Ru, Ta, Cu and an alloy of Al and Cu.

4. The magneto-resistive random access memory as claimed in claim 3, wherein a barrier layer formed of one of an aluminum nitride layer (AlN), a titanium nitride layer (TiN), and a tungsten nitride (WN) layer is formed under the lower electrode layer.

5. The magneto-resistive random access memory as claimed in claim 2, wherein the buffer layer is formed of Ta or Ru.

6. The magneto-resistive random access memory as claimed in claim 2, wherein the buffer layer is formed of one of IrMn, PtMn, and FeMn.

7. The magneto-resistive random access memory as claimed in claim 1, wherein the first magnetic layer is formed of a ferrimagnetic material.

8. The magneto-resistive random access memory as claimed in claim 7, wherein the first magnetic layer is formed of one of CoFe, Co, and NiCoFe.

9. The magneto-resistive random access memory as claimed in claim 1, wherein the dielectric barrier layer is formed of an alloy oxide layer in which hafnium is added to an aluminum oxide layer ($Al_2O_3$).

10. The magneto-resistive random access memory as claimed in claim 1, wherein the second magnetic layer is formed of a ferromagnetic material.

11. The magneto-resistive random access memory as claimed in claim 1, wherein the second magnetic layer is formed of a paramagnetic material.

12. The magneto-resistive random access memory as claimed in claim 11, wherein the second magnetic layer is Permalloy (Py(NiFe)).

13. The magneto-resistive random access memory as claimed in claim 1, wherein the upper electrode comprises at least one of Al, Ru, and Ta.

* * * * *